United States Patent [19]

Pintchovski et al.

[11] Patent Number: 5,126,283
[45] Date of Patent: Jun. 30, 1992

[54] PROCESS FOR THE SELECTIVE ENCAPSULATION OF AN ELECTRICALLY CONDUCTIVE STRUCTURE IN A SEMICONDUCTOR DEVICE

[75] Inventors: Faivel Pintchovski; John R. Yeargain, both of Austin; Stanley M. Filipiak, Pflugerville, all of Tex.

[73] Assignee: Motorola, Inc., Schaumburg, Ill.

[21] Appl. No.: 526,071

[22] Filed: May 21, 1990

[51] Int. Cl.$^5$ .......................... H01L 21/283
[52] U.S. Cl. .................... 437/188; 437/192; 437/194; 437/197; 437/246; 437/983
[58] Field of Search ............... 437/192, 194, 246, 983, 437/188, 197; 148/DIG. 18

[56] References Cited

U.S. PATENT DOCUMENTS

| | | | |
|---|---|---|---|
| 3,935,083 | 1/1976 | Tomozawa et al. | 437/194 |
| 4,372,809 | 2/1983 | Grewal et al. | 437/194 |
| 4,557,036 | 12/1985 | Kyuragi et al. | 29/571 |
| 4,870,033 | 9/1989 | Hotta et al. | 437/192 |
| 4,944,682 | 7/1990 | Cronin et al. | 437/129 |
| 4,962,060 | 10/1990 | Sliwa et al. | 428/651 |

FOREIGN PATENT DOCUMENTS

| | | | |
|---|---|---|---|
| 264418 | 2/1989 | Fed. Rep. of Germany | |
| 49-032636 | 8/1974 | Japan | |
| 88046641 | 3/1983 | Japan | 437/246 |
| 58-197855 | 11/1983 | Japan | 437/194 |
| 59-79550 | 5/1984 | Japan | 437/197 |
| 61-132402 | 10/1986 | Japan | |
| 62-030349 | 2/1987 | Japan | 437/194 |
| 63-016641 | 1/1988 | Japan | 437/192 |
| 1-107558 | 4/1989 | Japan | 437/194 |
| 1-268043 | 10/1989 | Japan | 437/190 |
| 1-286444 | 11/1989 | Japan | 437/194 |

OTHER PUBLICATIONS

E. G. Colgan et al., "Thin-film Reactions of AL with Co, Cr, Mo, Ta, Ti and W," *J. Mater. Res.*, 4 (4), 1989.
R. Hutchings et al, "Compositional Dependence of Oxidation Rates of NiAl and CoAl," *Metal Science* (ab) vol. 12, No. 11, pp. 503-510, Nov. 1978.
Y. Pauleau, "Interconnect Materials for VLSI Circuits," *Solid State Technology*, Apr. 1987 pp. 155-162.
C. Y. Ting et al., "The Use of Ti-based Contact Barrier Layers in Si Technology," *Thin Solid Films*, 96 (1982) pp. 327-345.

*Primary Examiner*—Brian E. Hearn
*Assistant Examiner*—Laura M. Holtzman
*Attorney, Agent, or Firm*—Jasper W. Dockrey

[57] ABSTRACT

A process for fabricating an improved semiconductor device is disclosed wherein a protective layer of $Al_2O_3$ is selectively formed to encapsulate a refractory-metal conductor. To form the $Al_2O_3$ layer, first an Al/refractory-metal alloy is selectively formed on the surface of the refractory-metal conductor, then the Al/refractory-metal alloy is reacted with $O_2$. The resulting $Al_2O_3$ encapsulation layer acts as an $O_2$ diffusion barrier preventing the oxidation of the refractory-metal during subsequent process steps used to fabricate the semiconductor device. In addition, the $Al_2O_3$ layer improves the mechanical compatibility of the refractory-metal conductor with other materials used to construct the semiconductor device, such as, for example, improving the adhesion of an overlying layer of passivation glass to the refractory-metal conductor.

15 Claims, 4 Drawing Sheets

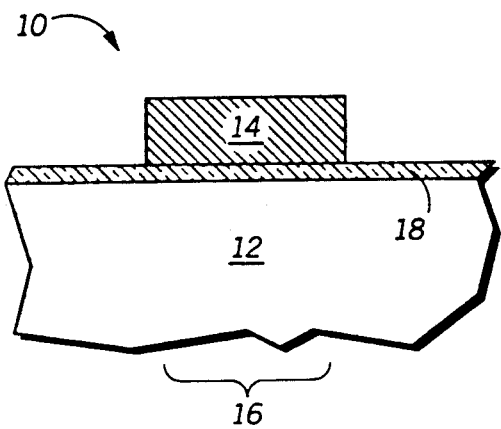
FIG.1-a
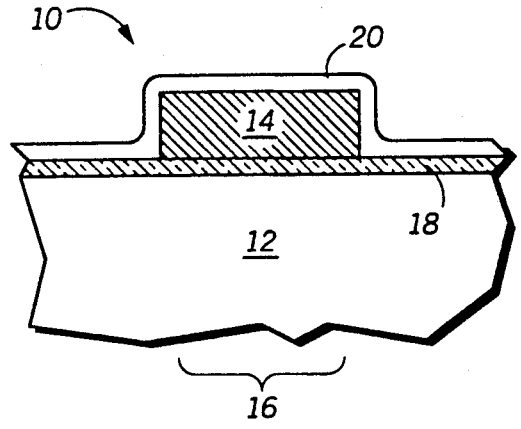
FIG.1-b
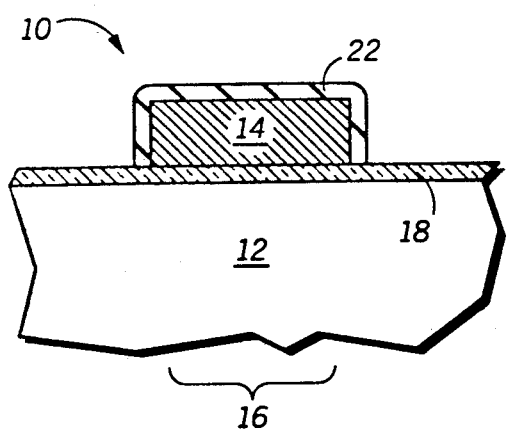
FIG.1-c
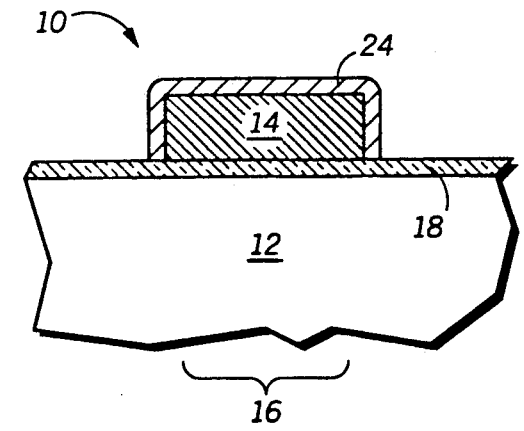
FIG.1-d

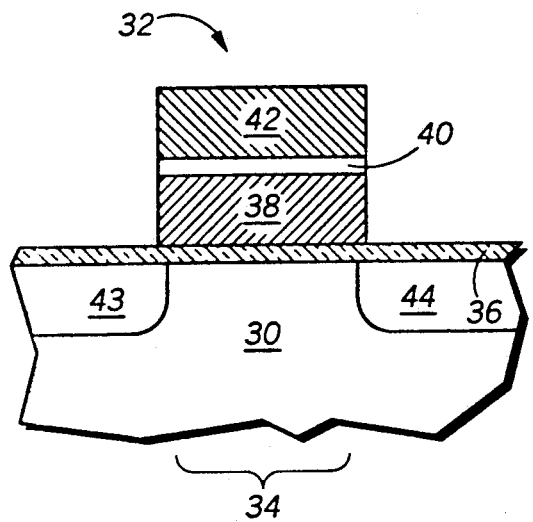
*FIG.3-a*
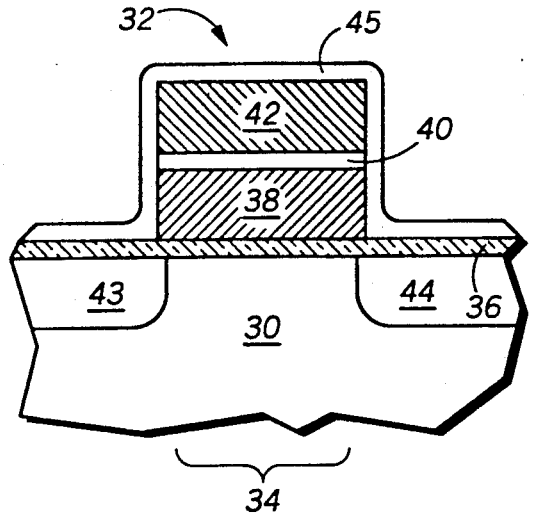
*FIG.3-b*
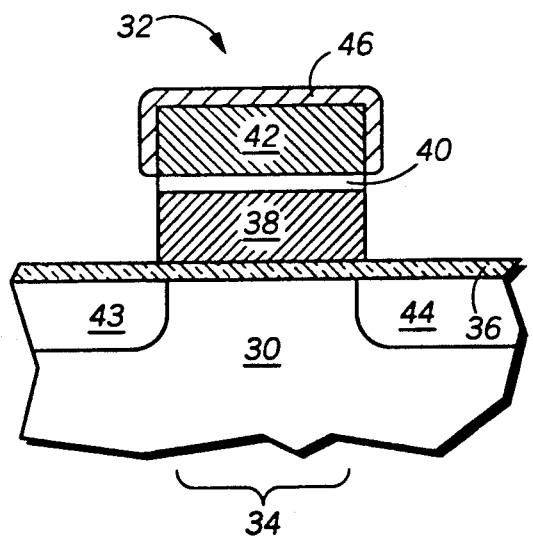
*FIG.3-c*

PROCESS FOR THE SELECTIVE ENCAPSULATION OF AN ELECTRICALLY CONDUCTIVE STRUCTURE IN A SEMICONDUCTOR DEVICE

BACKGROUND OF THE INVENTION

This invention relates in general to a method for fabricating a semiconductor device, and more particularly to a method for selectively forming a protective coating on electrically conductive structures within a semiconductor device.

As semiconductor device manufacturers continue to design high performance integrated circuits to meet customer performance demands, a corresponding need for increased signal transmission rates within the device requires the use of electrically conductive materials having low electrical resistance. Those refractory-metals which have a low bulk resistivity have long been considered as materials with potential application for use as a gate electrode, a local interconnect, a capacitor plate or other electrically conductive structure within a semiconductor device. The use of refractory-metals as electrical conductors has been limited because of their lack of compatibility with other materials commonly used in the construction of semiconductor devices. For example, refractory-metals are easily oxidized when exposed to high temperatures commonly encountered in device fabrication. Furthermore, they are susceptible to chemical degradation upon contact with process chemicals used in the fabrication of very-large-scale-integration (VLSI) devices. Additionally, in general passivation materials, such as passivation glasses deposited over conductive leads and transistor gates, do not adhere well to refractory-metals.

In the place of pure refractory-metals, refractory-metal silicides have been commonly used because of their greater degree of compatibility with existing process technology. A disadvantage of the use of refractory-metal silicides in high performance VLSI devices is their inherently high bulk electrical resistivity, 60 to 100 $\mu\Omega$-cm, versus 6-12 $\mu\Omega$-cm for selected refractory-metals. The large bulk electrical resistance of refractory-metal silicides does not permit the attainment of high signal transmission rates required by state-of-the-art VLSI devices. Therefore, it would be advantageous if a process could be provided that would permit the application of substantially pure refractory-metals for use as transistor gates, interconnects, capacitor plates, electrical leads and the like.

BRIEF SUMMARY OF THE INVENTION

In practicing the present invention there is provided a process for fabricating a semiconductor device having refractory-metal conductive structures protected from oxidation, and other forms of chemical degradation, by an encapsulating layer of $Al_2O_3$. The encapsulation process proceeds by a selective formation of an alloy layer, having an Al component and a refractory-metal component, on the exposed surface area of the refractory-metal conductor. Once an alloy is formed on the surface of the conductor, an oxidation reaction is carried out which oxidizes the alloy layer and selectively forms the protective layer of $Al_2O_3$ over the refractory-metal conductor. In one embodiment of the invention, a substrate is provided having device regions thereon. A dielectric layer is formed to overlie the substrate and a refractory-metal conductor is formed on the device region having a horizontal surface and substantially vertical wall surfaces. A layer of $Al_2O_3$ is selectively formed to overlie the refractory-metal conductor, wherein the $Al_2O_3$ layer overlies the horizontal and substantially vertical wall surfaces of the refractory-metal conductor.

BRIEF DESCRIPTION OF THE DRAWINGS

FIGS. 1-$a$ through 1-$d$ illustrate, in cross section, process steps in accordance with one embodiment of the invention;

FIGS. 3-$a$ through 3-$c$ illustrate, in cross section, process steps in accordance with another embodiment of the invention;

Figure 2:
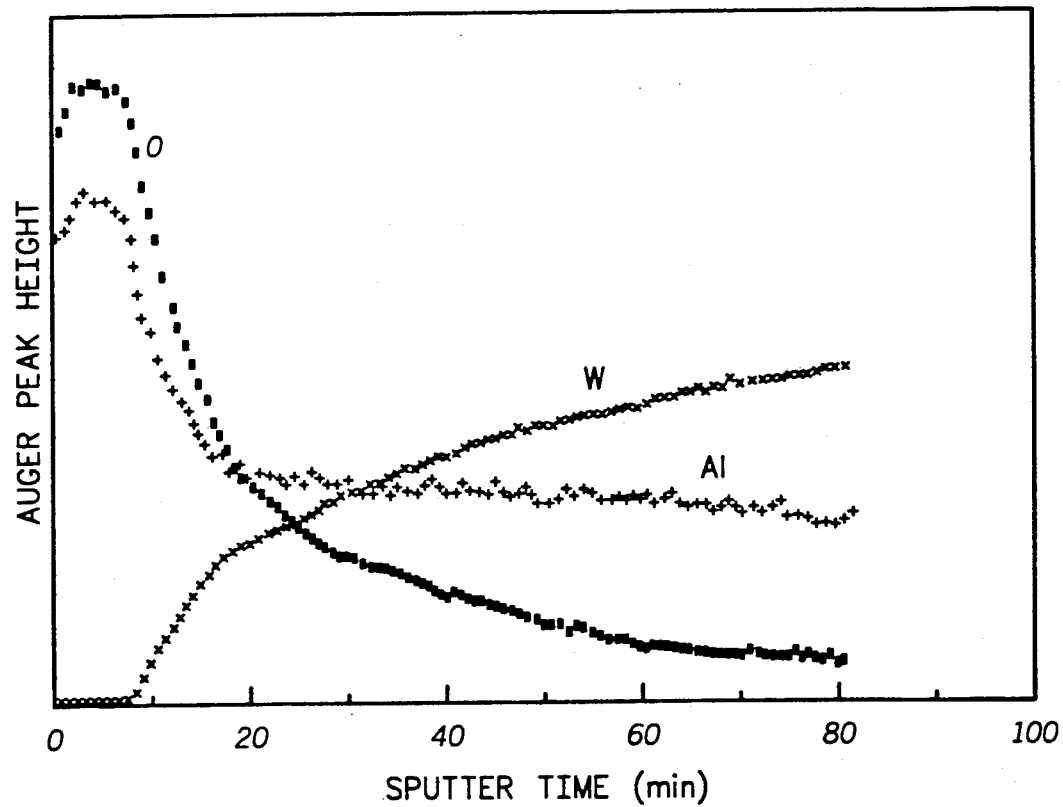
FIG. 2 is a graph showing Auger spectroscopy data taken from a sample fabricated in accordance with the invention.

It will be appreciated that in FIGS. 1, 3, 4 and 5 the proportions of the various elements are not to scale. For example, the dimensions of some of the elements are exaggerated relative to each other for clarity.

DETAILED DESCRIPTION OF THE PREFERRED EMBODIMENTS

Various aspects of the invention will now be described in detail with reference to the Figures. FIGS. 1-$a$ through 1-$d$ illustrate, in cross section, process steps in accordance with one embodiment of the invention wherein a refractory metal conductor is formed having an alumina ($Al_2O_3$) layer encapsulating the conductor. The $Al_2O_3$ layer provides a barrier to the diffusion of oxygen ($O_2$) therethrough preventing the oxidation of the underlying refractive-metal during subsequent processing of the substrate. Additionally, the $Al_2O_3$ layer protects the underlying refactory-metal from chemical degradation caused by contact with process chemicals commonly used during semiconductor device fabrication. The refractory-metal conductor can be any patterned conductive layer used in a semiconductor device. More particularly, the refractory metal conductor can be a transistor gate, a local interconnect, a wiring lead and the like. Such a structure could be used, for example, in a static-random-access-memory (SRAM), a dynamic-random-access-memory (DRAM), a microprocessor, a Bi-CMOS device or other integrated circuit structure where a high electrical signal transmission rate is required through a conductive element.

FIG. 1-$a$ illustrates, in cross section, a portion of a semiconductor substrate which has already undergone some of the processing steps used in the fabrication of a semiconductor device in accordance with one embodiment of the invention. The structure illustrated includes, a portion 10 of a semiconductor substrate 12 having a conductor 14 overlying a device region 16 of substrate 12. A dielectric layer 18 is disposed on the surface of substrate 12 and electrically isolates conductor 14 from substrate 12. Dielectric layer 18 can be a thermally grown dielectric layer obtained by the thermal oxidation of substrate 12, or alternatively, dielectric layer can be a chemical-vapor-deposition (CVD) deposited $SiO_2$ layer. Additionally, dielectric layer 18 can be a doped silicate glass (SG) layer formed by CVD, wherein dopant atoms such as boron (B), to form BSG, phosphorus (P), to form PSG, or a combination of B and P, to form BPSG, are incorporated into the silicate glass. Conductor 14 is an electrically conductive element such as previously described, of a semiconductor device, comprised of a refractrory-metal selected from the group consisting of tungsten (W), molybdenum (Mo), chromium (Cr), cobalt (Co) and platinum (Pt).

In a one embodiment, conductor 14 is W metal deposited onto dielectric layer 18 by the method of sputter deposition. The deposited thickness of the W layer depends upon the type of conductive structure to be formed, for example, in the case where refractory metal conductor 14 is to be a transistor gate electrode, the W layer is deposited to a thickness of about 80 to 120 nanometers. In the case where conductor 14 is to be an electrical wiring structure such as, for example, a local interconnect, the W layer is deposited to a thickness of about 750 to 1250 nanometers. The sputter deposition of the W layer is carried out by, for example, radio-frequency (RF) sputtering from a W target in an inert atmosphere at a reduced pressure. Alternatively, the W layer can be deposited by means of CVD deposition, wherein tungsten hexafluoride (WF$_6$) is reacted with excess hydrogen (H$_2$) according to the proposed reaction:

$$WF_6 + 3H_2 \rightarrow W + 6HF \quad (1)$$

Following the deposition of the W layer, conductor 14 is formed by first forming a photoresist pattern on the W layer using conventional photolithography. Next, the W layer is selectively, anisotropically etched by means of a reactive ion etching using a hydrocarbon gas such as CF$_2$Cl$_2$, CFCl$_3$, CF$_3$Cl or a bromonated hydrocarbon gas such as CF$_3$Br and the like, and O$_2$. The anisotropic, reactive ion etch is a directional etch wherein W is etched in the vertical direction many times more rapidly than in the lateral direction thereby forming structures having substantially vertical sidewalls. Additionally, the etch is selective in that, W is etched much more rapidly than underlying dielectric layer 18. Therefore, upon complete removal of the unpatterned portion of the W layer, only a relatively small amount of dielectric layer 18 is removed. It is to be understood that in the practice of the present invention other W etching methods can be used without departing from the invention. For example, the W layer can be isotropically etched by means of a liquid etching solution comprising potassium hydroxide and potassium ferricyanide. The formation of conductor 14 is then completed with the removal of the photoresist pattern resulting in the structure shown in FIG. 1-a.

The process continues with the deposition of an aluminum (Al) layer 20 onto substrate 12, as shown in FIG. 1-b. Aluminum layer 20 is deposited as a continuous layer over conductor 14 preferably to a thickness of about 50 to 100 nanometers. In one embodiment of the invention, Al layer 20 is deposited by means of RF sputtering in an Argon (Ar) atmosphere from an Al target. Aluminum layer 20 can also be deposited as an Al alloy containing silicon (Si) or copper (Cu), or combinations thereof. Alternatively, Al layer 20 can be formed by the thermal decomposition of an Al-complexed organometallic compound. For example, triisobutylaluminum (CH$_2$CH(CH$_3$)$_2$)$_3$Al) can be decomposed to form an Al film by carrying out a thermal decomposition reaction in an inert atmosphere at about 200° to 300° C.

After Al layer 20 is deposited onto conductor 14, substrate 12 is subjected to thermal energy to induce a reaction between the refractory metal of conductor 14 and the Al of Al layer 20. In one embodiment, an alloy is formed in the region of the interface of the two metal layers having the stoichiometric proportion WAl$_{12}$. As previously pointed out, other refractory metals can be used to form conductor 14. The formation of several Al/refractory metal alloys are described in recent publications, for example, "Thin-film Reactions of AL with Co, Cr, Mo, Ta, Ti and W", E. G. Colgan et al., J. Mater. Res., 4 (4), 1989. Other alloys preparable by the reaction of Al with the stated refractory metals include, TiAl$_3$, TaAl$_3$, MoAl$_{12}$, Cr$_x$Al$_y$ and Co$_p$Al$_q$, where x,y,p and q are integers. The reaction is preferably carried out in a rapid thermal annealing (RTA) apparatus, wherein substrate 12 is subjected to high intensity, broad-band radiation from for example, an incoherent light source for a time duration of about 15 to 240 seconds. One skilled in the art will recognize that other radiation sources can be used such as, coherent sources, laser light sources, arc lamps and the like, and that these sources would require different annealing times to form the Al/refractory-metal alloy. Alternatively, the Al/refractory-metal alloy can be formed by furnace annealing in an inert atmosphere at about 400° to 500° C. At this point, by means of the inventive process, an WAl$_{12}$ alloy has been selectively formed exclusively in regions where Al layer 20 and conductor 14 are in intimate contact with each other.

Once the WAl$_{12}$ alloy has been formed, the remaining unreacted portion of Al layer 20 is removed from substrate 12 as shown in FIG. 1-c. The unreacted portion of Al layer 20 can be removed by means of a wet chemical etching process, a dry plasma etching process, or a combination thereof. In one embodiment of the invention, a wet chemical etching solution comprising a mixture of nitric acid, phosphoric acid, acetic acid and water is used to isotropically remove substantially all of the remaining unreacted portion of Al layer 20. Alternatively, other wet etching solutions can be used such as chemical solutions containing ammonium hydroxide and hydrogen peroxide. Furthermore, a dry plasma etching process such as a reactive ion etching process employing etching gases selectively reactive with Al can be used. The removal of the remaining unreacted portion of Al layer 20 yields conductive structures on substrate 12 having an encapsulating alloy layer 22 disposed on all exposed surfaces of the conductive structures. As illustrated in FIG. 1-c, alloy layer 22 continuously extends over the horizontal and vertical surfaces of conductor 14 encapsulating the unreacted metal within the interior of conductor 14.

After conductor 14 has been encapsulated by alloy layer 22, an oxidation reaction is carried out to form an encapsulating layer of Al$_2$O$_3$ by means of a gas-solid reaction between O$_2$ gas and the Al component of alloy layer 22. The Al$_2$O$_3$ formation reaction is believed to proceed as follows:

$$WAl_{12} + 10.5O_2 \rightarrow 6Al_2O_3 + WO_3 \quad (2)$$

wherein tungsten trioxide (WO$_3$) is a gaseous product of the reaction. Reaction (2) is preferably carried out at about 600° to 800° C. in an RTA apparatus. In one method, substrate 12 is placed in a reaction chamber within the RTA apparatus and oxygen is introduced to the chamber creating an oxygen atmosphere. At the stated reaction temperature, and in excess $O_2$, a layer of $Al_2O_3$ is formed having a thickness which is dependent upon the exposure time of substrate 12 within the RTA apparatus. For example, upon expose of substrate 12 to broad-band radiation within the RTA apparatus for about 15 to 300 seconds, a layer $Al_2O_3$ forms on the surface of conductor 14 to a thickness of about 10 to 20 nanometers. Alternatively, the formation of a layer of $Al_2O_3$, according to reaction (2), can be carried out in a conventional convection furnace.

The formation of a protective layer of $Al_2O_3$ on the surface of conductor 14 by the oxidation of alloy layer. 22, is illustrated in FIG. 1-d. As a result of the oxidation of the alloy layer 22, an encapsulation layer 24 has been selectively formed exclusively in areas of substrate 12 where alloy layer 22 is present. The process of selectively encapsulating electrically conductive structures has the advantage of providing a means of creating an encapsulating layer that is impervious to oxygen diffusion thereby preventing the oxidation of any portion of the encapsulated electrically conductive structure during subsequent processing of substrate 12. Additionally, encapsulation layer 24 protects the underlying W from chemical degradation caused by contact with processing chemicals commonly used during subsequent circuit fabrication steps.

During the oxidation process, the oxidation reaction occurs substantially within alloy layer 22 and very little O2 diffuses through alloy layer 22 to react with the underlying metal of conductor 14. FIG. 2 shows Auger electron spectroscopy data, as a plot of peak height versus sputtering time (in minutes), obtained from a sample prepared by the method of the present invention. As denoted in FIG. 2, the oxygen concentration, indicated by the line identified as (O), declines rapidly as a function of the sputtering time, which is proportional to the depth into the sample. The data presented in FIG. 2 suggests that a gas-solid oxidation reaction occurs substantially within the first 10 to 20 nanometers from the surface and virtually completely within the domain of alloy layer 22. The confinement of the oxidation reaction to regions within alloy layer 22 preserves the integrity of the underlying refractory-metal present in conductor 14. Additionally, the Auger data indicates the absence of any unreacted portion of alloy layer 22 remaining after carrying out the oxidation reaction to form encapsulation layer 24. The complete oxidation of alloy layer 22 is evidenced by the absence of W, indicated by the line identified as (W), at the surface.

Without further elaboration, it is believed that one skilled in the art can, using the preceding description, utilize the invention to its fullest extent. The following preferred specific embodiments are, therefore, to be construed as merely illustrative, and not limitative of the remainder of the disclosure in any way whatsoever.

EXAMPLE 1

It will be appreciated by those skilled in the art that other conductive structures can be formed by the process of the present invention. For example, a multi-layered transistor gate having a polysilicon layer and an overlying encapsulated refractory metal layer can be formed using the previously described process. Another embodiment of the invention is shown in FIG. 3-a, which illustrates, in cross section, a gate structure having undergone several process steps in accordance the invention. The gate structure includes a portion of a semiconductor substrate 30 having a composite transistor gate 32 overlying a device region 34 of substrate 30. A gate dielectric layer 36 is disposed on substrate 30 separating transistor gate 32 from substrate 30. Transistor gate 32 is comprised of a polysilicon layer 38 overlying gate dielectric layer 36, a diffusion barrier layer 40 overlying polysilicon layer 38 and a refractory-metal layer 42 overlying diffusion barrier layer 40. Diffusion barrier layer 40 is preferably comprised of a refractory-metal nitride, such as for example, titanium nitride (TIN). In a manner known in the art, source and drain regions 43 and 44 are preferably formed in substrate 30 which are aligned to the edge of transistor gate 32 by means of ion implantation of an ionic species of opposite conductivity type to that of substrate 30 using transistor gate 32 as an implantation mask. Alternatively, source and drain regions 43 and 44 can be formed by thermal diffusion of a dopant atom of opposite conductivity to that of substrate 30. The gate structure illustrated in FIG. 3-a can be used as a high speed transistor gate in a number of semiconductor devices such as DRAMs, SRAMs, microprocessors and the like.

The encapsulation of refractory-metal layer 42 is accomplished by depositing an Al layer 45 to conformably overlie transistor gate 32, as shown in FIG. 3-b. Using processing steps previously described, substrate 30 is subjected to thermal energy to form an Al/refractory-metal alloy in the region of the interface between Al layer 45 and refractory-metal layer 42. It should be noted that the Al/refractory-metal alloy selectively forms exclusively on the exposed surfaces of refractory-metal layer 42 which are in intimate contact with Al layer 45 and not on other portions of transistor gate 32.

In a similar manner to that previously described, unreacted portions of Al layer 45 are removed from substrate 30 and an oxidation reaction is carried out to selectively form an $Al_2O_3$ layer 46 solely encapsulating refractory-metal layer 42, as illustrated in FIG. 3-c. A composite transistor gate 32 has been fabricated, by the selective process of the present invention, to have an encapsulated refractory metal layer that is fully protected from oxidation, and other forms of chemical degradation, arising from the subsequent processing steps used to completely fabricate an integrated circuit.

EXAMPLE 2

Figure 4:
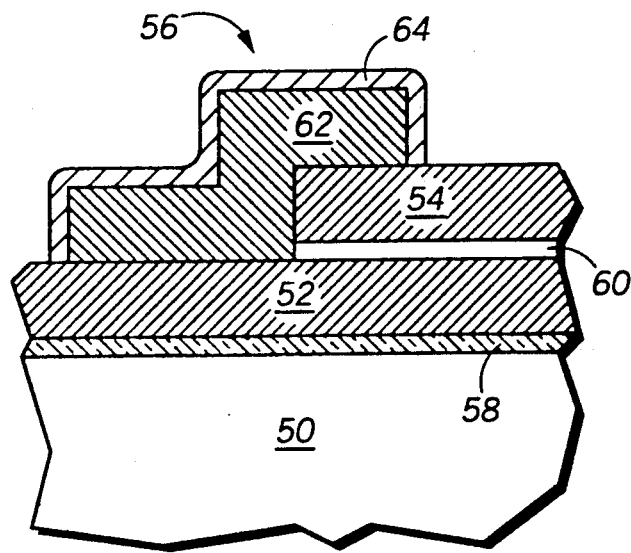
FIG. 4 illustrates, in cross section, a local interconnect fabricated in accordance with the process of the invention.

Shown in FIG. 4, in cross section, is a local interconnect fabricated by the process of the present invention. The local interconnect structure is comprised of a semiconductor substrate 50, a first conductive layer 52, a second conductive layer 54 and an $Al_2O_3$ encapsulated refractory-metal lead 56. First conductive layer 52 is electrically isolated from substrate 50 by a first dielectric layer 58 and second conductive layer 54 is electrically isolated from first conductive layer by a second dielectric layer 60. Refractory-metal lead 56 forms an electrical conduit between first conductive layer 52 and second conductive layer 54 providing an electrical connection between the two conductive layers which are otherwise electrically isolated from each other.

Refractory-metal lead 56 is formed by first conformably depositing a layer of refractory-metal to overlie first conductive layer 52, an edge portion of second dielectric layer 60 and second conductive layer 54. The refractory-metal is selected from the group consisting of W, Mo, Cr, Co and Pt. Next, the refractory-metal layer is patterned and etched using conventional photolithography and anisotropic reactive ion etching to form a lead segment 62. After etching the photoresist pattern is removed from lead segment 62 and a layer of Al is conformably deposited to overlie first conductive layer 52, lead segment 62 and second conductive layer 54. In a manner consistent with that previously described, an Al/refractory-metal alloy is selectively formed on the surface of lead segment 62 at the interface between lead segment 62 and the overlying Al layer. Once the alloy is formed an oxidation reaction is carried out and an $Al_2O_3$ layer 64 is formed encapsulating lead segment 62.

EXAMPLE 3

Figure 5:
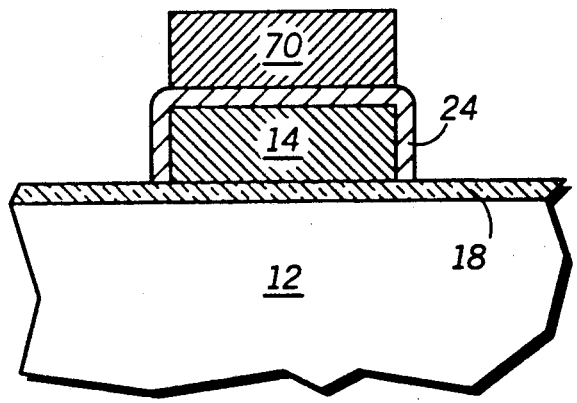
FIG. 5 illustrates, in cross section, a high performance transistor fabricated in accordance with the process of the invention.

Encapsulation layer 24, being comprised of $Al_2O_3$, has a sufficiently high dielectric constant to enable the use of encapsulation layer 24 as a capacitor dielectric material. The conductor structure shown in FIG. 1-d can be further processed to form a high performance capacitor in a semiconductor device of the present invention. In order to fabricate a high performance capacitor first the structure shown in FIG. 1-d is prepared. Once conductor 14 and encapsulation layer 24 have been formed, a second conductive layer can be deposited, then patterned and etched to form a top plate 70, as shown in FIG. 5. Top plate 70 can be prepared from a number of electrically conductive materials such as polysilicon, a refractory metal silicide, Al, Cu, and the like.

In a manner consistent with the level of skill in the art to which the present invention pertains, further process steps are carried out, in accordance with the present invention, to complete the fabrication of an integrated circuit device. Depending upon the particular configuration and sequence of photomasking layers, the process of the present invention can be used as an integral part of a complete process further employing additional process steps to fabricate an MOS device such as a DRAM, SRAM, data processor device, Bi-CMOS device, bi-polar device and the like.

Thus it is apparent that there has been provided, in accordance with the invention, a method for selectively forming an encapsulation layer on an electrically conductive structure which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various methods for etching both the alloy and unreacted portions of the $Al_2O_3$ layer can be used such as electron cyclotron resonance etching, sputter etching and the like. It is therefore intended to include within the invention all such variations and modifications as fall within the scope of the appended claims and equivalents thereof.

We claim:

1. A method for fabricating a semiconductor device comprising:
    providing a substrate having a device region thereon;
    forming a dielectric layer to overlie the substrate;
    forming a refractory-metal conductor on the device region having a horizontal surface and substantially vertical wall surfaces;
    forming a layer of Al overlying the refractory metal conductor and the dielectric layer;
    reacting Al and refractory metal to form an Al alloy layer;
    etching away unreacted Al from the surface of the substrate; and
    oxidizing the Al alloy layer to form an $Al_2O_3$ layer overlying the refractory-metal conductor, wherein the $Al_2O_3$ layer overlies only the horizontal and substantially vertical wall surfaces of the refractory-metal conductor.

2. The method of claim 1 wherein the refractory-metal is selected from the group consisting of W, Mo, Cr, Co and Pt.

3. The method of claim 1 wherein the semiconductor device is one of a DRAM, SRAM, data processor device or Bi-CMOS device.

4. A method for fabricating an MOS transistor gate comprising:
    providing a substrate having a device region thereon;
    forming a dielectric layer to overlie the substrate;
    forming a gate electrode on the device region wherein the gate electrode comprises, a polysilicon layer directly overlying the dielectric layer, a TiN layer overlying the polysilicon layer and a refractory-metal layer overlying the TiN layer;
    forming a layer of Al overlying the refractory gate electrode and the dielectric layer;
    reacting Al and refractory metal to form an Al alloy layer;
    etching away unreacted Al from the dielectric layer; and
    oxidizing the Al alloy layer to form an $Al_2O_3$ layer solely overlying the exposed surface regions of the refractory-metal layer.

5. A method for forming a local interconnect in a semiconductor device comprising:
    forming a refractory-metal lead on a semiconductor substrate having a plurality of conductive layers thereon, the refractory-metal lead providing an electrical conduit between the plurality of conductive layers;
    depositing a layer of Al to overly the refractory-metal lead and the semiconductor substrate;
    applying thermal energy to react the Al layer with the refractory-metal lead to form an Al/refractory-metal alloy on the surface of the refractory-metal lead;
    removing the unreacted Al from the semiconductor substrate; and
    oxidizing the Al/refractory-metal alloy to form a layer of $Al_2O_3$ encapsulating the refractory-metal lead.

6. The method of claim 5 wherein the refractory-metal is selected from the group consisting of W, Mo, Cr, Co and Pt.

7. A method for preventing the oxidation of a refractory-metal conductor in a semiconductor device comprising:
    forming a refractory-metal conductor on a semiconductor substrate;
    reacting the refractory-metal with Al to form an Al/refractory-metal alloy on the surface of the refractory-metal conductor; and
    oxidizing the Al/refractory-metal alloy to form a layer of $Al_2O_3$ encapsulating the refractory-metal conductor wherein the $Al_2O_3$ layer provides a barrier to oxygen diffusion therethrough.

8. The method of claim 7 wherein the refractory-metal is selected from the group consisting of W, Mo, Cr, Co and Pt.

9. The method of claim 7 wherein the semiconductor device is one of a DRAM, SRAM, data processor, bi-polar device or Bi-CMOS device.

10. A method for fabricating a low resistance electrical conductor in a semiconductor device comprising:
providing a single crystal silicon substrate having a device region thereon;
oxidizing the substrate to form a silicon dioxide dielectric layer thereon;
depositing a layer of W onto the dielectric layer;
forming a photoresist pattern on the layer of W
etching the layer of W to form a W conductor over the device region of the substrate;
removing the photoresist pattern;
depositing a layer of Al onto the substrate;
annealing the substrate to selectively form a layer of $WAl_{12}$ between the Al layer and the W conductor and to leave an unreacted portion of the Al layer;
etching away the unreacted portion of the Al layer from the substrate; and
oxidizing the $WAl_{12}$ layer to selectively form a layer of $Al_2O_3$ encapsulating the W conductor.

11. The method of claim 10 wherein the step of annealing the substrate to form the layer of $WAl_{12}$ is carried out by means of rapid thermal annealing.

12. The method of claim 10 wherein the step of oxidizing $WAl_{12}$ layer is carried out by means of rapid thermal annealing in an $O_2$ atmosphere.

13. The method of claim 10 wherein the step of depositing a layer of W is carried out by reacting $WF_6$ with excess $H_2$ in a CVD reactor.

14. A method for fabricating a high performance capacitor in a semiconductor device comprising:
providing a substrate having a device region thereon;
forming a dielectric layer to overlie the substrate;
forming a refractory-metal conductor on the device region having a horizontal surface and substantially vertical wall surfaces;
forming a layer of Al overlying the refractory metal conductor and remaining portions of the substrate;
reacting Al and refractory metal to form an Al alloy layer;
etching away unreacted Al from the surface of the substrate;
oxidizing the Al alloy layer to form an $Al_2O_3$ layer overlying the refractory-metal conductor to form a capacitor dielectric wherein the $Al_2O_3$ layer overlies only the horizontal and substantially vertical wall surfaces of the refractory-metal conductor; and
forming a conductive top plate overlying the $Al_2O_3$ layer and aligned to the wall surfaces of the refractory metal conductor.

15. The method of claim 14 wherein the refractory-metal is selected from the group consisting of W, Mo, Cr, Co and Pt.

* * * * *